(12) United States Patent
Kim et al.

(10) Patent No.: US 7,642,824 B2
(45) Date of Patent: Jan. 5, 2010

(54) PLL CIRCUIT AND METHOD OF CONTROLLING THE SAME

(75) Inventors: Yong-Ju Kim, Gyenoggi-Do (KR);
Kun-Woo Park, Gyeonggi-do (KR);
Jong-Woon Kim, Gyeonggi-do (KR);
Hee-Woong Song, Gyeonggi-do (KR);
Ic-Su Oh, Gyeonggi-do (KR);
Hyung-Soo Kim, Gyeonggi-do (KR);
Tae-Jin Hwang, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 125 days.

(21) Appl. No.: 11/819,603

(22) Filed: Jun. 28, 2007

(65) Prior Publication Data

US 2008/0068057 A1 Mar. 20, 2008

(30) Foreign Application Priority Data

Sep. 14, 2006 (KR) .................. 10-2006-0088814

(51) Int. Cl.
*H03L 7/093* (2006.01)
*H03L 7/08* (2006.01)

(52) U.S. Cl. .................. 327/157; 327/558; 331/1 R
(58) Field of Classification Search .................. None
See application file for complete search history.

(56) References Cited

U.S. PATENT DOCUMENTS

| | | | | |
|---|---|---|---|---|
| 4,383,216 | A * | 5/1983 | Dorler et al. ............... 323/282 |
| 6,029,250 | A | 2/2000 | Keeth | |
| 6,392,497 | B1 * | 5/2002 | Takikawa ..................... 331/17 |
| 6,430,696 | B1 | 8/2002 | Keeth | |
| 6,570,457 | B2 * | 5/2003 | Fischer ......................... 331/17 |
| 6,724,268 | B2 * | 4/2004 | Takahashi .................... 331/57 |
| 6,912,680 | B1 | 6/2005 | Keeth | |
| 6,963,232 | B2 * | 11/2005 | Frans et al. ................. 327/156 |
| 7,026,879 | B2 * | 4/2006 | Booth ........................ 331/17 |
| 7,154,786 | B2 | 12/2006 | Ikai et al. | |
| 7,173,461 | B2 * | 2/2007 | Tan et al. .................... 327/157 |
| 2006/0066759 | A1 | 3/2006 | Ikuma et al. | |
| 2006/0119405 | A1 | 6/2006 | Kobayashi | |

FOREIGN PATENT DOCUMENTS

JP 4107011 4/1992

(Continued)

*Primary Examiner*—Lincoln Donovan
*Assistant Examiner*—Terry L Englund
(74) *Attorney, Agent, or Firm*—Venable LLP; Jeffri A. Kaminski

(57) ABSTRACT

A PLL circuit includes a phase detector that compares the phase of an input clock with the phase of a feedback clock so as to generate pull-up and pull-down control signals. A low pass filter pumps a voltage in response to the pull-up and pull-down control signals, and removes a noise component from the pumped voltage so as to output a control voltage. A buffer that controls voltage so as to generate a bias voltage having a smaller swing width than the control voltage. A voltage controlled oscillator receives the bias voltage and oscillates an output clock. A clock divider divides the frequency of the output clock at a predetermined ratio so as to generate the feedback clock.

10 Claims, 2 Drawing Sheets

FOREIGN PATENT DOCUMENTS

| | | |
|---|---|---|
| JP | 2004047066 | 2/2004 |
| JP | 2004070800 | 3/2004 |
| KR | 10-1991-0009089 | 5/1991 |
| KR | 100251631 | 1/2000 |
| KR | 2000-0017468 | 3/2000 |
| KR | 1020030091524 | 12/2003 |
| KR | 1020040091662 | 10/2004 |

\* cited by examiner

PLL CIRCUIT AND METHOD OF CONTROLLING THE SAME

CROSS-REFERENCE TO RELATED PATENT APPLICATION

This application claims the benefit of Korean Patent Application No. 10-2006-0088814, filed on Sep. 14, 2006, in the Korean Intellectual Property Office, the disclosure of which is incorporated herein in its entirety by reference.

BACKGROUND OF THE INVENTION

1. Technical Field

The present invention relates to a PLL (Phase Locked Loop) circuit and a method of controlling the same, and in particular, to a PLL circuit that stably performs a phase locking operation of a clock and a method of controlling the same.

2. Related Art

With the advancement of a higher-speed semiconductor memory apparatus, the frequency of an external clock increases, and accordingly the frequency of an internal clock also increases. With the increase in frequency of the internal clock, in the known semiconductor memory apparatus that uses a DLL (Delay Locked Loop) circuit, an operation to input/output data in synchronization with a clock becomes unstable. In particular, in a high-speed semiconductor memory apparatus, such as a graphic memory or the like, since a timing margin between a data strobe signal generated by the clock and data is decreased, reliability of a data input operation is deteriorated.

In a current semiconductor memory apparatus, a method that uses a PLL circuit in order to improve reliability of the data input operation has been introduced. This semiconductor memory apparatus compares the timing of the clock and input data with each other using the PLL circuit to measure a phase difference. Then, the phase of the data is controlled with respect to the clock, such that the data is in phase with the clock. Therefore, reliability of the data input operation is improved.

A general PLL circuit includes a low pass filter that pumps a voltage by the pull-up control signal and the pull-down control signal, and removes noise from the pumped voltage.

As shown in FIG. 1, the low pass filter includes a charge pump and a filter unit 6 in general. The charge pump includes pull-up pump unit 2 and a pull-down pump unit 4.

The pull-up pump unit 2 has a first voltage pump 3 and a PMOS transistor PMOS. The first voltage pump 3 generates a first pumping voltage Vpmp1 from an external power supply VDD. The PMOS transistor PMOS supplies the first pumping voltage Vpmp1 to a first node N1 in response to the pull-up control signal plup.

The pull-down pump unit 4 has an NMOS transistor and a second voltage pump 5. The NMOS transistor NMOS transmits a voltage of the first node N1 to the second voltage pump 5 in response to the pull-down control signal pldn. The second voltage pump 5 pumps the voltage of the first node N1 transmitted from the NMOS transistor NMOS to a second pumping voltage Vpmp2, and supplies the pumped voltage to the ground terminal VSS. That is, general charge pump receives the pull-up control signal plup and the pull-down control signal pldn.

The filter unit 6 removes a noise component of a signal applied to the first node N1 and outputs the signal with no noise component as a control voltage Vctrl. The filter unit 6 may include one capacitor and one resistor.

Generally, in the PLL circuit, if the input clock and the feedback clock are in phase, the pull-up control signal plup and the pull-down control signal pldn input to the low pass filter are all enabled. At this time, the first node N1 has a signal having a constant level, and the phase of the clock is fixed corresponding to the signal generated at the first node N1. However, the signal formed at the first node N1, which is a connection node of the pull-up pump unit 2 and the pull-down pump unit 4 constituting the charge pump of the low pass filter, does not have a constant level. This is caused by a difference in operability between the first voltage pump 3 and the second voltage pump 5, a difference in resistance between the PMOS transistor PMOS and the NMOS transistor NMOS, and a difference in characteristic between the PMOS transistor and the NMOS transistor due to PVT (Process, Voltage, and Temperature) factors.

As such, if the connection node between the pull-up pump unit 2 and the pull-down pump unit 4 of the low pass filter does not keep the signal having the constant level, the control voltage Vctrl may not fall within a prescribed swing range, and as a result, a voltage ripple phenomenon that the final output clock does not fall within a prescribed frequency band may occur. This voltage ripple phenomenon causes an error in the phase locking operation of the clock.

Further, the voltage ripple phenomenon may grow heavier due to a difference in current between the pull-up pump unit 2 and the pull-down pump unit 4 constituting the charge pump of the low pass filter, a difference in electric charge injection amount, a difference in electric charge division amount, and p/n mismatching of the components constituting the pump units 2 and 4.

SUMMARY OF THE INVENTION

An embodiment of the invention provides a PLL circuit that can prevent a voltage ripple phenomenon, thereby stably performing a phase locking operation of a clock.

Another embodiment of the invention provides a method of controlling a PLL circuit that can ensure stability in the operation.

According to an embodiment of the invention, a PLL circuit includes a low pass filter that filters an input voltage and outputs a control voltage, and a buffer that buffers the control voltage so as to generate a bias voltage.

According to another embodiment of the invention, a PLL circuit includes a phase detector that compares the phase of an input clock with the phase of a feedback clock and generates pull-up and pull-down control signals, a low pass filter that pumps a voltage in response to the pull-up and pull-down control signals, and removes a noise component from the pumped voltage so as to output a control voltage, a buffer that additionally buffers the control voltage so as to generate a bias voltage having a smaller swing width than the control voltage, a voltage controlled oscillator that receives the bias voltage and oscillates an output clock, and a clock divider that divides the frequency of the output clock at a predetermined ratio so as to generate the feedback clock.

DESCRIPTION OF EXEMPLARY EMBODIMENT

The present invention will now be described more fully with reference to the accompanying drawings, in which exemplary embodiments of the invention are shown. The invention may, however, be embodied in many different forms and should not be construed as being limited to the embodiments set forth herein; rather, these embodiments are provided so that this disclosure will be thorough and complete, and will fully convey the concept of the invention to those skilled in the art.

Figure 1:
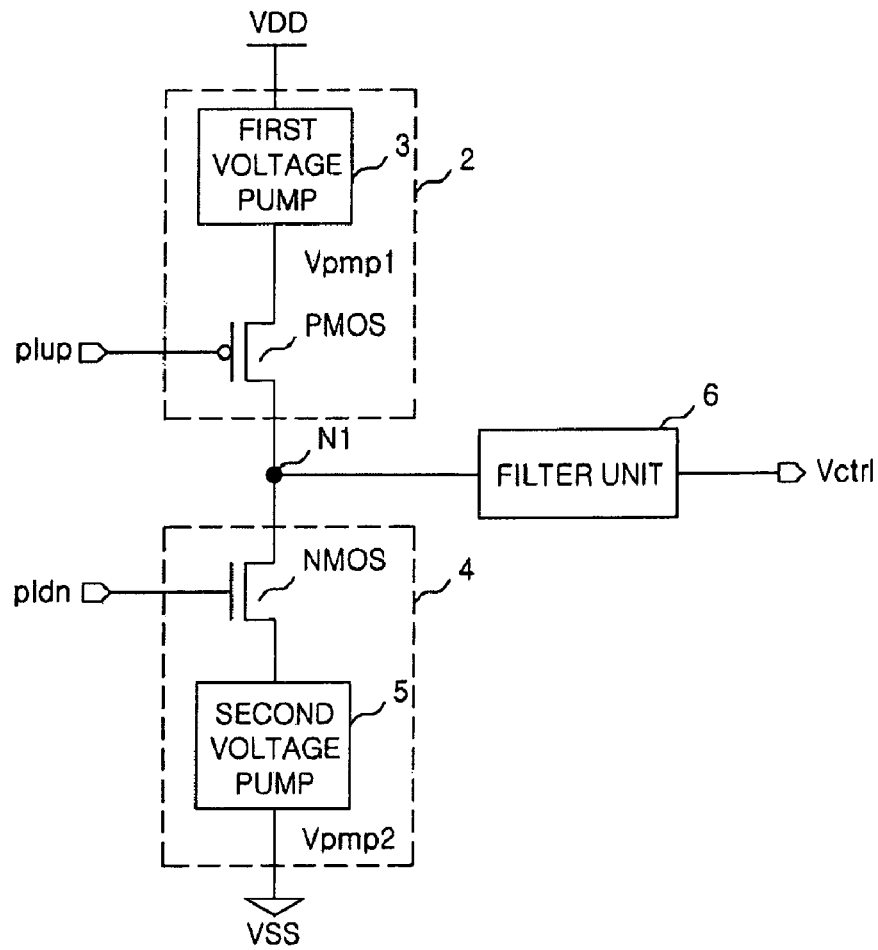
FIG. 1 is a diagram showing a low pass filter of a general PLL circuit.
Figure 2:
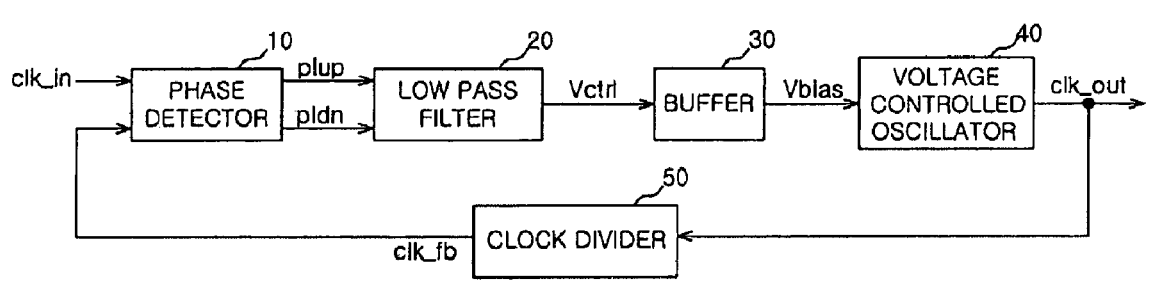
FIG. 2 is a block diagram showing a PLL circuit according to an embodiment of the invention.

Referring to FIG. 2, a PLL circuit 100 includes a phase detector 10, a low pass filter 20, a buffer 30, a voltage controlled oscillator 40, and a clock divider 50.

The phase detector 10 compares an input clock clk_in with a feedback clock clk_fb fed back from the clock divider 50 to generate a pull-up control signal plup and a pull-down control signal pldn. If the input clock clk_in and the feedback clock clk_fb are in phase, the phase detector 10 enables and outputs the pull-up control signal plup and the pull-down control signal pldn.

The low pass filter 20 pumps a voltage in response to the pull-up control signal plup and the pull-down control signal pldn, and removes a noise component from the pumped voltage so as to output a control voltage Vctrl. At this time, the control voltage Vctrl may be at a level corresponding to the input of the pull-up control signal plup and the pull-down control signal pldn. A circuit structure of the low pass filter 20 may be same with that of the prior art.

The buffer 30 buffers the control voltage Vctrl so as to generate a bias voltage Vbias. The bias voltage Vbias has a smaller swing width than the control voltage Vctrl.

Figure 3:
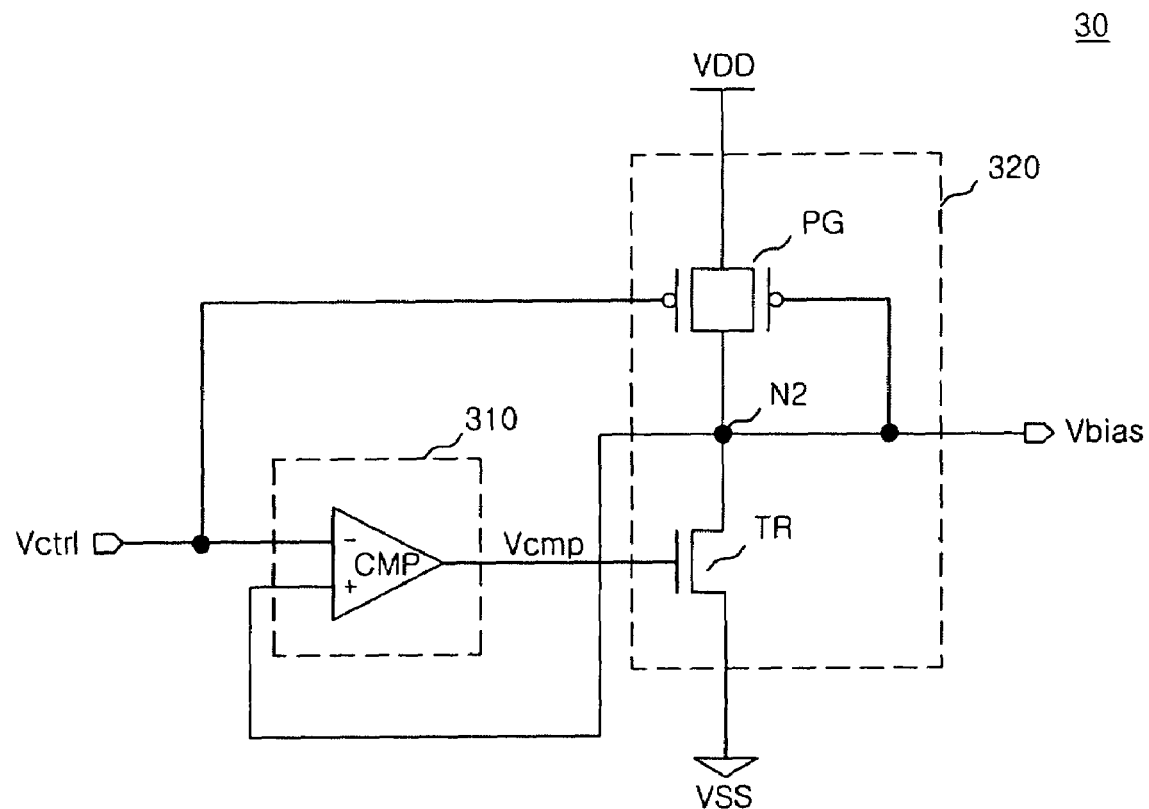
FIG. 3 is a circuit diagram showing the detailed configuration of a buffer shown in FIG. 2.

As shown in FIG. 3, the buffer 30 may include a comparator 310 and a voltage generator 320.

The comparator 310 compares the control voltage Vctrl with the feedback bias voltage Vbias so as to generate a comparison voltage Vcmp. As the comparator 310, a general comparator may be used.

The voltage generator 320 controls the potential level of the bias voltage Vbias according to the potential levels of the control voltage Vctrl, the bias voltage Vbias, and the comparison voltage Vcmp. The voltage generator 320 may be composed of a pass gate PG and a switching element TR. The pass gate PG supplies an external power supply VDD to a second node N2 according to the potential levels of the control voltage Vctrl and the bias voltage Vbias. In this embodiment, the pass gate PG may be composed of, for example, a pair of PMOS transistors. The switching element transmits the voltage of the second node N2 to a ground terminal VSS according to the comparison voltage Vcmp. The switching element may be a transistor TR.

In such a buffer 30, if the potential level of the control voltage Vctrl to be supplied from the low pass filter 20 becomes lower than a prescribed potential level, that is, if the potential level of the control voltage Vctrl to be generated in the low pass filter 20 is lowered due to a difference in characteristics of the elements constituting the low pass filter 20, the amount of a current flowing through the pass gate PG of the buffer increases, and the potential level of the second node N2 rises. Simultaneously, the potential level of the comparison voltage Vcmp, which is an output signal of the comparator 310, also increases, and thus the amount of a current flowing in the switching element increases. The amount of power supply to the second node N2 is adjusted by controlling the bias voltage Vbias or the pass gate PG. As a result, the potential of the second node N2 has a smaller swing width than the control voltage Vctrl. Here, the bias voltage Vbias having a smaller swing width than the control voltage Vctrl can mean that the swing width of the control voltage Vctrl is reduced by removing ripple of the control voltage Vctrl.

In contrast, if the potential level of the control voltage Vctrl becomes higher, the amount of the current flowing through the pass gate PG decreases, and the potential of the second node N2 falls. At this time, the potential level of the comparison voltage Vcmp output from the comparator 310 also decreases, and thus the amount of the current flowing through the transistor TR decreases. In addition, the amount of power supply to the second node N2 is adjusted by controlling the bias voltage Vbias or the pass gate PG. As a result, the potential of the second node N2 has a smaller swing width than the control voltage Vctrl. At this time, the swing width of the bias voltage Vbias that is formed at the second node N2 can be set by controlling the sizes of the pass gate PG and the transistor TR.

Referring back to FIG. 2, the voltage controlled oscillator 40 receives the bias voltage Vbias having an adjusted swing width from the buffer 30, to oscillate an output clock clk_out. The voltage controlled oscillator 40 can generate the output clock clk_out within a prescribed frequency band. That is, the voltage controlled oscillator 40 generates the output clock clk_out from the bias voltage Vbias within a prescribed small swing range. Even if the potential of the control voltage Vctrl does not fall within the prescribed range, since the buffer 30 outputs the bias voltage Vbias that swings within the prescribed range, an erroneous operation of the PLL circuit can be prevented.

The clock divider 50 divides the frequency of the output clock clk_out at a predetermined ratio so as to generate the feedback clock clk_fb. The clock divider 50 can also generate feedback clock clk_fb within a prescribed frequency band.

According to an embodiment of the invention, since the PLL circuit includes the buffer, the PLL circuit can generate the bias voltage having a smaller swing width than the control voltage, and generate the output clock using the bias voltage, thereby generating a more stable output clock. Therefore, even if the level of the control voltage does not fall within the prescribed range due to a difference in operability of the voltage pumps, a difference in resistance of the transistors, or the PVT factors, an output clock having a prescribed frequency can be generated, and thus a phase locking operation of a clock can be more accurately performed.

Figure 4:
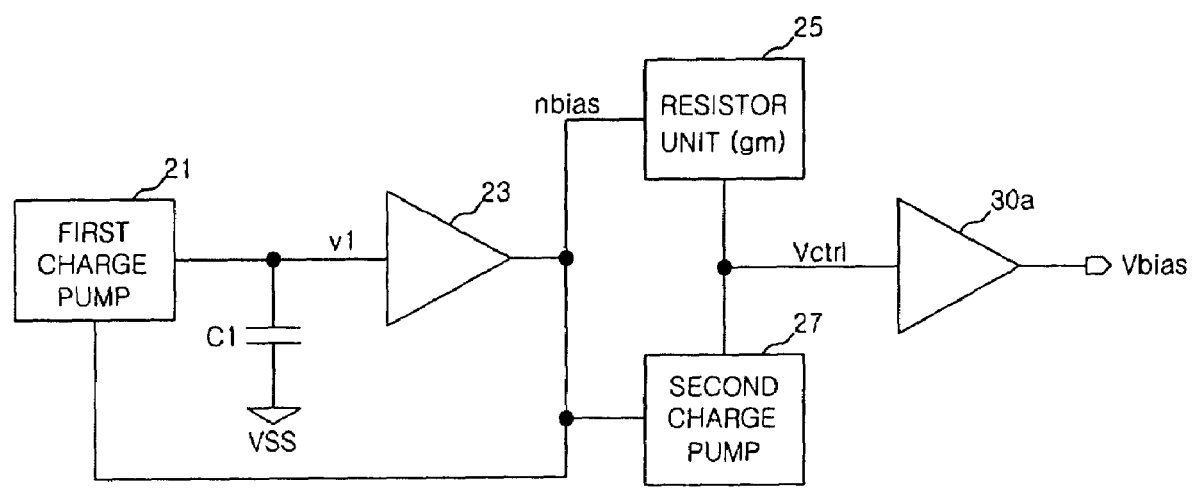
FIG. 4 is a block diagram showing the internal structure of a low pass filter in a PLL circuit according to another embodiment of the invention.

In another embodiment, as shown in FIG. 4, a buffer 30a may be provided in a low pass filter 20a of the PLL circuit.

As shown in FIG. 4, the low pass filter 20a includes a first charge pump 21, a capacitor C1, a first buffer 23, a resistor unit(gm) 25, a second charge pump 27, and a second buffer 30a.

The first charge pump 21 is configured to drive the capacitor C1, and a voltage V1 that passes through the capacitor C1 is primarily stabilized by the first buffer 23. A first bias nbias primarily stabilized by the first buffer 23 and a voltage of the first charge pump 21 are supplied to a resistor unit(gm) 25 and the second charge pump 27. The second charge pump 27 receives the first bias nbias. The resistor unit(gm) 25 is driven by a voltage supplied from the second charge pump 27, and performs a filtering operation together with the capacitor C1, thereby generating the control voltage Vctrl. Although not shown in FIG. 4, the first and second charge pumps may receive the pull-up and pull down control signals from the phase detector 20, respectively, as in the prior art.

As known in the art, in the low pass filter 20a, it is preferable that a current flowing in the first charge pump 21 is consistent with a current flowing in the second charge pump 27. However, the current flowing in the first charge pump 21 and the current flowing in the second charge pump 27 may be different from each other due to a difference in PVT characteristic of the components constituting the charge pumps and a difference in electric charge injection amount and division amount to be supplied to the charge pumps 21 and 27. Due to the difference in current, the control voltage Vctrl may have a ripple.

Accordingly, the second buffer 30a is additionally provided at the output terminal of the control voltage Vctrl so as to filter the ripple of the control voltage Vctrl. Here, the second buffer 30a may have the same structure as that shown in FIG. 3.

As such, the buffer 30a may be provided in the low pass filter 20a.

It will be apparent to those skilled in the art that various modifications and changes may be made without departing from the scope and spirit of the invention. Therefore, it should be understood that the above embodiment is not limitative, but illustrative in all aspects. The scope of the invention is defined by the appended claims rather than by the description preceding them, and therefore all changes and modifications that fall within metes and bounds of the claims, or equivalents of such metes and bounds are therefore intended to be embraced by the claims.

What is claimed is:

1. A PLL circuit comprising:
   a low pass filter that receives an input voltage to output a control voltage; and
   a buffer that removes ripples of the control voltage so as to generate a bias voltage, wherein the buffer is configured to adjust a potential of an output node thereof in response to the control voltage and the bias voltage and wherein the low pass filter further includes a first charge pump, a second charge pump and an internal buffer, the internal buffer is coupled between the first charge pump and the second charge pump, and the second charge pump is coupled between the internal buffer and the buffer.

2. The PLL circuit of claim 1,
   wherein a swing width of the bias voltage is smaller than a swing width of the control voltage.

3. The PLL circuit of claim 1,
   wherein the buffer includes:
   a comparator that compares the control voltage with the bias voltage so as to generate a comparison voltage; and
   a voltage generator that controls a potential level of the bias voltage according to the potential levels of the control voltage, the bias voltage, and the comparison voltage.

4. The PLL circuit of claim 3,
   wherein the voltage generator includes
   a pass gate that supplies an external power supply to a first node according to the potential levels of the control voltage and the bias voltage; and
   a transistor that has a gate terminal, to which the comparison voltage is applied, and is provided between the first node and a ground terminal.

5. The PLL circuit of claim 1, further comprising:
   a phase detector that compares a phase of an input clock with a phase of a feedback clock to supply the input voltage to the low pass filter.

6. The PLL circuit of claim 1, further comprising:
   a voltage controlled oscillator that oscillates an output clock in response to the bias voltage.

7. The PLL circuit of claim 6,
   wherein the buffer is connected between the low pass filter and the voltage controlled oscillator.

8. The PLL circuit of claim 6, further comprising:
   a clock divider that divides a frequency of the output clock at a predetermined ratio so as to generate a feedback clock.

9. The PLL circuit of claim 1,
   wherein the low pass filter includes
   a capacitor operated by the first charge pump, and
   a resistor unit that performs a filtering operation together with the capacitor.

10. The PLL circuit of claim 9, wherein
    the internal buffer that buffers a voltage passing through the capacitor.

* * * * *